United States Patent
Gossner

(10) Patent No.: US 6,751,077 B2
(45) Date of Patent: Jun. 15, 2004

(54) ESD PROTECTION CONFIGURATION FOR SIGNAL INPUTS AND OUTPUTS WITH OVERVOLTAGE TOLERANCE

(75) Inventor: Harald Gossner, Riemerling (DE)

(73) Assignee: Infineon Technologies AG, Munich (DE)

( * ) Notice: Subject to any disclaimer, the term of this patent is extended or adjusted under 35 U.S.C. 154(b) by 67 days.

(21) Appl. No.: 10/100,579

(22) Filed: Mar. 18, 2002

(65) Prior Publication Data

US 2002/0118499 A1 Aug. 29, 2002

Related U.S. Application Data

(63) Continuation of application No. PCT/DE00/03251, filed on Sep. 15, 2000.

(30) Foreign Application Priority Data

Sep. 16, 1999 (DE) .......................................... 199 44 488

(51) Int. Cl.[7] .................................................. H02H 9/00
(52) U.S. Cl. .......................................... 361/56; 361/56
(58) Field of Search ............................... 361/54, 55, 56, 361/111, 91.1, 119

(56) References Cited

U.S. PATENT DOCUMENTS

| | | | | |
|---|---|---|---|---|
| 5,041,889 A | * | 8/1991 | Kriedt et al. ................ | 257/362 |
| 5,589,790 A | * | 12/1996 | Allen .......................... | 327/333 |
| 5,698,886 A | | 12/1997 | Thenoz et al. | |
| 5,796,296 A | * | 8/1998 | Krzentz ....................... | 327/545 |
| 5,869,872 A | | 2/1999 | Asai et al. | |
| 5,930,094 A | | 7/1999 | Amerasekera et al. | |
| 6,236,086 B1 | * | 5/2001 | Cheng ......................... | 257/355 |
| 6,347,026 B1 | * | 2/2002 | Sung et al. .................... | 361/56 |
| 6,459,553 B1 | * | 10/2002 | Drapkin et al. ................ | 361/56 |
| 6,552,886 B1 | * | 4/2003 | Wu et al. ...................... | 361/56 |

FOREIGN PATENT DOCUMENTS

| | | |
|---|---|---|
| DE | 38 06 766 A1 | 9/1988 |
| DE | 197 35 424 A1 | 5/1998 |
| EP | 0 893 868 A2 | 1/1999 |

* cited by examiner

*Primary Examiner*—Brian Sircus
*Assistant Examiner*—Danny Nguyen
(74) *Attorney, Agent, or Firm*—Laurence A. Greenberg; Werner H. Stemer; Gregory L. Mayback

(57) ABSTRACT

An ESD protective configuration for signal inputs and outputs is described. The inventive configuration is provided with an overvoltage tolerance, especially in CMOS circuits. An NMOS transistor acting as the ESD protective element is situated between an I/O pad and a low supply voltage, is impinged upon with an increased voltage at a gate thereof and is provided with a high threshold voltage.

4 Claims, 2 Drawing Sheets

ESD PROTECTION CONFIGURATION FOR SIGNAL INPUTS AND OUTPUTS WITH OVERVOLTAGE TOLERANCE

CROSS-REFERENCE TO RELATED APPLICATION

This application is a continuation of copending International Application PCT/DE00/03251, filed Sep. 15, 2000, which designated the United States.

BACKGROUND OF THE INVENTION

Field of the Invention

The present invention relates to an electrostatic discharge (ESD) protection configuration for signal inputs and outputs with overvoltage tolerance in, in particular, CMOS circuits, having an NMOS transistor which is configured as an ESD protection element and is connected to an I/O (input/output) pad (or contact pad) of the CMOS circuit.

In modern CMOS technology, components are configured for low operating voltages of 1.8 V or less in order, in the case of such optimized components, to keep the power loss thereof low, to obtain a higher packing density for them and, finally, also to achieve greater rapidity of individual transistors through smaller geometrical dimensions. Such optimization of the components in CMOS technology can be achieved without a relatively high outlay and affords considerable advantages, as has been indicated.

However, it cannot be avoided that many of the CMOS circuits realized in this technology also have to be used in electrical environments in which signals with higher voltages of, for example, 3.3 V or 5 V arise on these circuits. For this reason, in the case of such CMOS circuits, it is necessary to guarantee a higher dielectric strength in the I/O region than in their core region.

Since the gate oxide of CMOS transistors is damaged by voltages higher than nominal voltages, usually the voltage which is permitted to occur as a maximum across the gate oxide of the CMOS transistors used, taking account of the lifetime specified therefore, quite generally has a limiting effect.

In order to obtain a higher dielectric strength in the I/O region, two fundamentally different possibilities are initially conceivable. On the one hand, it is possible to use additional I/O transistors with a larger gate oxide thickness. However, this leads to the fabrication process being made considerably more expensive, so that this possibility is to be regarded as less economic. On the other hand, it is possible to use particular circuitry measures for, for example, inverters or output drivers of the CMOS circuit, such as, for example, stacking of NMOS transistors and driving of the well of a PMOS transistor, which is also referred to as a "floating well". In practice, the concept of the "stacked" NMOS and of the "floating well" PMOS as ESD protection has scarcely gained any acceptance since it leads to a reduction of the ESD performance, that is to say specifically to a lower ESD strength and a higher clamping voltage.

Solution approaches that have been described hitherto in the technical literature for the above problem of a higher dielectric strength in the I/O region of CMOS circuits use a series circuit of NMOS transistors (see the reference by W. Anderson, D. Krakauer, titled EOS/ESD Symp. Proc., 1998, pp. 54–62) which are configured as ESD protection elements. However, such a series circuit often reduces the ESD performance with regard to the ESD strength of the corresponding ESD protection element and the voltage limiting in the high-current range, resulting in a reduced protection effect.

Thick oxide transistors, which are based on shallow trench isolation in modern CMOS technology, have a poor ESD strength and are scarcely taken into consideration as protection elements in technologies other than in LOCOS. As an alternative, it is also possible to use substrate-triggered lateral NPN transistors. However, in the technical literature, these are only discussed in connection with epitaxy processes (see the reference by J. Smith, titled EOS/ESD Symp. Proc., 1998, pp. 63–71).

SUMMARY OF THE INVENTION

It is accordingly an object of the invention to provide an ESD protection configuration for signal inputs and outputs with an overvoltage tolerance which overcomes the above-mentioned disadvantages of the prior art devices of this general type, which allows the I/O region of CMOS circuits to be protected against overvoltages in a simple manner and with a high ESD performance.

With the foregoing and other objects in view there is provided, in accordance with the invention, a combination of a CMOS circuit having an input/output pad and a low supply voltage terminal conducting a low supply voltage, and an electrostatic discharge (ESD) protection configuration for signal inputs and outputs with an overvoltage tolerance for the CMOS circuit. The ESD protection configuration includes an NMOS transistor having a gate and functioning as an ESD protection element connected between the input/output pad and the low supply voltage terminal. The NMOS transistor has a channel with a corresponding doping or lightly doped regions formed in the channel resulting in a high threshold voltage of about 2 V being obtained. A voltage divider is connected to the input/output pad and applies an increased voltage of about 1 V to the gate. The voltage divider contains a parallel circuit formed by a capacitor connected in parallel with a resistor.

In the case of an ESD protection configuration of the type mentioned in the introduction, the object is achieved according to the invention by virtue of the fact that the NMOS transistor is connected between the I/O pad and the low supply voltage. The NMOS transistor has a high threshold voltage requiring an increased voltage to be applied to the gate of the NMOS transistor.

Thus, in the case of the ESD protection configuration according to the invention, an NMOS transistor having a high threshold voltage, which may be about 2 V, is used as the central ESD protection element. An increased voltage, of 1 V for example, is required to be applied to gate of the NMOS transistor. In this case, no relevant leakage current occurs. As a result of the bias voltage at the gate, however, the voltage drop across the gate oxide to the drain side of the NMOS transistor decreases correspondingly.

The increase in the threshold voltage of the NMOS transistor can be achieved by a suitable doping of its lightly doped (LDD) regions as now described. By way of example, the n+-conducting source zone and the n+-conducting drain zone are provided with a pldd-implantation instead of an nldd implantation (pldd=lightly p-doped; nldd=lightly n-doped) in their respective region adjoining the channel beneath the gate electrode.

Another possibility for increasing the threshold voltage relates to introducing an additional channel doping, for example by implantation, in the channel region between the source zone and the drain zone, so that there is an increased p-type doping concentration here in the case of n+-doped source and drain zones.

Both of the possibilities mentioned above, mainly a suitable doping of the LDD regions and a corresponding channel doping, can be realized relatively simply. In particular, the replacement of nldd by pldd in the LDD regions can be realized without an additional process step. This is true irrespective of whether or not an epitaxy technology is used to realize the ESD protection configuration.

Finally, in the case of the ESD protection configuration according to the invention, the circuitry of the gate of the NMOS transistor does not pose any problems either. The bias voltage for a gate of 1 V, for example, can be derived from a voltage, such as a bandgap voltage for example, generated in the CMOS circuit. Another possibility is to incorporate between the I/O pad and the low supply voltage a high-impedance voltage divider, for example using a PNP transistor.

Although the ESD protection configuration according to the invention is preferably used in CMOS circuits, it can also be used in the case of other components, such as, for example, thyristors based on NMOS transistors.

Other features which are considered as characteristic for the invention are set forth in the appended claims.

Although the invention is illustrated and described herein as embodied in an ESD protection configuration for signal inputs and outputs with an overvoltage tolerance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
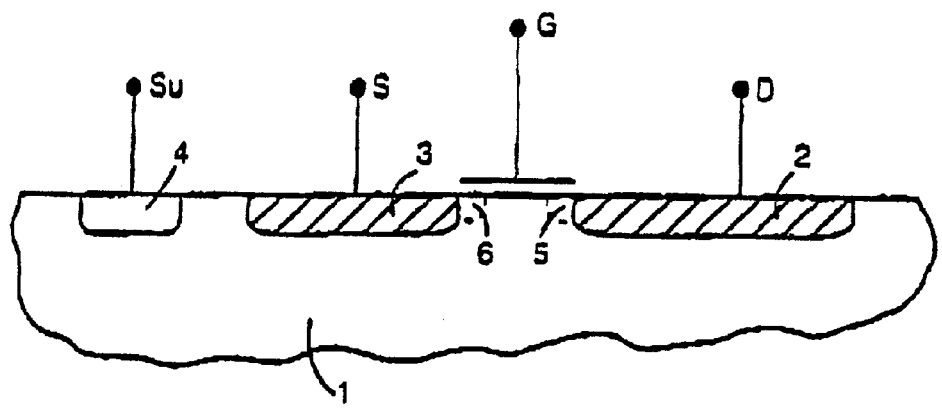
FIG. 1 is a diagrammatic, sectional view of an ESD protection transistor with a high threshold voltage due to a pldd-implantation according to the invention.

Referring now to the figures of the drawing in detail and first, particularly, to FIG. 1 thereof, there is shown a p-conducting silicon well 1, an n+-conducting drain zone 2 with a drain electrode D, an n+-conducting source zone 3 with a source electrode S, and a p+-conducting contact or terminal zone 4 with a substrate contact Su. In order to increase its threshold voltage, the ESD protection transistor thus formed has pldd-implantation regions (lightly p-doped regions) 5, 6. The pldd-implantation regions 5, 6 are provided instead of nldd-implantation regions that are otherwise present, and bring about an increase in the threshold voltage through a lengthening of a channel between the source zone 3 and the drain zone 2.

Figure 2:
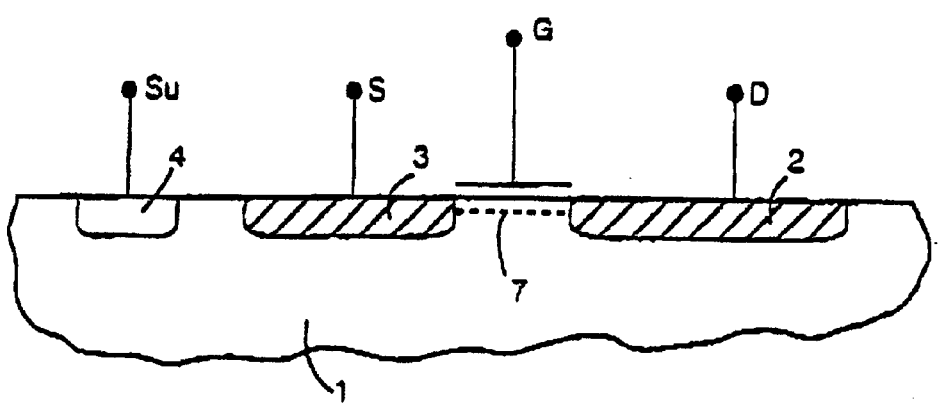
FIG. 2 is a diagrammatic section view of the ESD protection transistor with a high threshold voltage due to an additional channel implantation.

The increase in the threshold voltage can also be achieved if an additional channel implantation 7 is provided in the channel region between the source zone 3 and the drain zone 2, as is shown diagrammatically in FIG. 2.

The text below describes, with reference to FIGS. 3 to 7, how the VHV-NMOS transistor with an increased threshold voltage as shown in FIG. 1 or 2 is connected up in the ESD protection configuration according to the invention.

Figure 3:
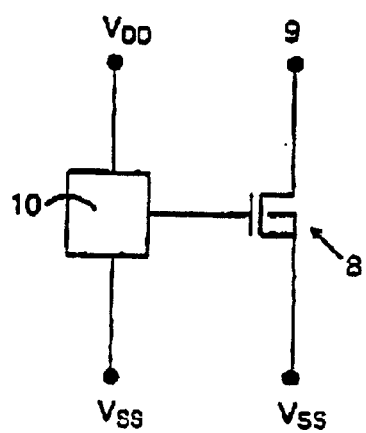
FIG. 3 is a block circuit diagram of an ESD protection configuration relative to a low supply voltage $V_{ss}$ for an overvoltage-tolerant signal or I/O pad on the basis of a high-voltage or VHV-NMOS transistor with a driven gate.

FIG. 3 shows an example in which such a VHV-NMOS transistor 8 is connected between an I/O or signal pad 9 and a low supply voltage $V_{ss}$. A gate of the VHV-NMOS transistor 8 is connected to a voltage source 10 formed by the CMOS circuit between a low supply potential $V_{ss}$ and a high supply potential Vdd.

Figure 4:
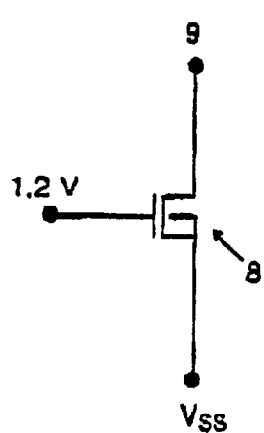
FIGS. 4 and 5 are block circuit diagrams showing two examples of the driving of a gate of a VHV-NMOS transistor serving as the ESD protection element.

FIG. 4 shows an example in which a bandgap voltage of 1.2 V is used as a bias voltage for the VHV-NMOS transistor 8. The bandgap voltage of 1.2 V is present in CMOS circuits for example at "phase-locked loops" (PLL).

Figure 5:
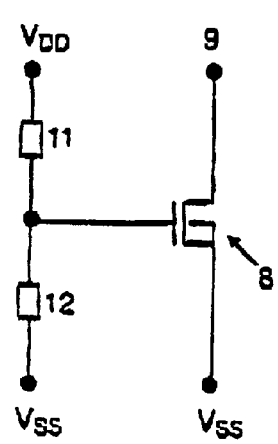

FIG. 5 shows a further example of the generation of the bias voltage for the VHV-NMOS transistor 8. In this example, a voltage divider containing two resistors 11, 12 is used for generating the bias voltage. The resistors are connected in series between the low supply voltage $V_{ss}$ and a high supply voltage Vdd.

Figure 6:
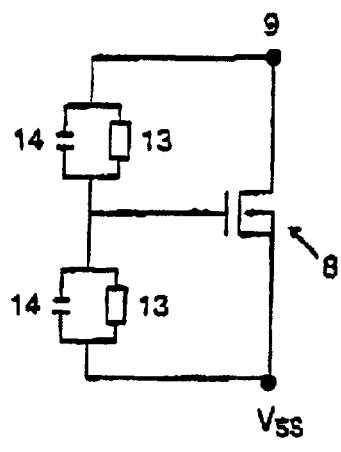
FIG. 6 is a block circuit diagram of a circuit example of a high-impedance voltage divider at the I/O pad for driving the gate of the VHV-NMOS transistor.
Figure 7:
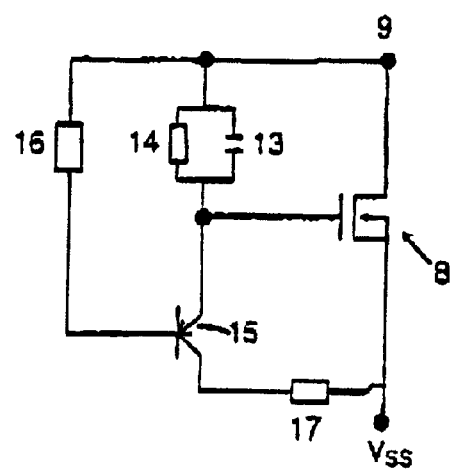
FIG. 7 is a block circuit diagram of a further circuit example of a high-impedance voltage divider at the I/O pad for driving the gate of the VHV-NMOS transistor.

Whereas the bias voltage for the VHV-NMOS transistor 8 is generated in the CMOS circuit in the examples of FIGS. 3 to 5, this is done by high-impedance voltage dividers in the examples of FIGS. 6 and 7. The voltage dividers are directly connected to the I/O pad 9 and have the low supply voltage $V_{ss}$ applied to their other end. In FIG. 6, the voltage divider contains parallel circuits formed by a resistor 13 and a capacitor 14, whereas in the example of FIG. 7 one parallel circuit of the example of FIG. 6 is replaced by a PNP transistor 15 whose gate is connected to the I/O pad 9 via a resistor 16. A collector of the transistor 15 is connected to the low supply voltage $V_{ss}$ via a resistor 17.

Figure 8:
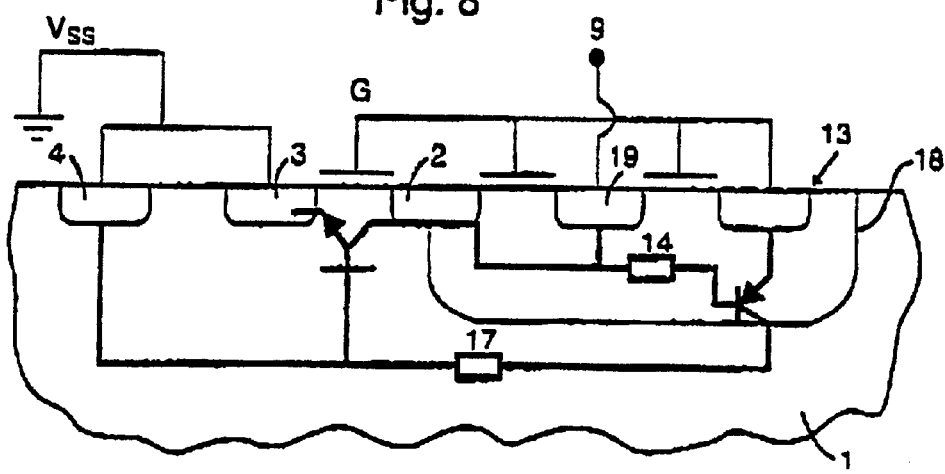
FIG. 8 is a diagrammatic, sectional view of a compact embodiment of the high-impedance voltage divider shown in FIG. 7.

FIG. 8 diagrammatically shows how, for example, the circuit configuration of FIG. 7 can be realized with a compact embodiment. In addition to the parts already explained, FIG. 8 also shows an n-conducting well 18 and an n+-conducting contact or terminal region 19 for the n-conducting well 18.

Figure 9:
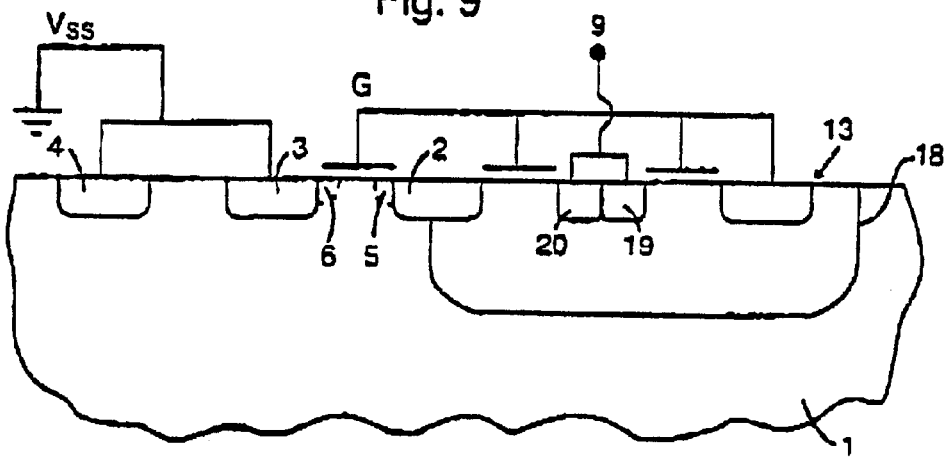
FIG. 9 is a diagrammatic, sectional view of a thyristor based on the VHV-NMOS transistor.

Finally, FIG. 9 shows an example of how a thyristor structure can be produced by providing a further p+-conducting zone 20 in the n-conducting well 18.

I claim:

1. In combination with a CMOS circuit having an input/output pad and a low supply voltage terminal conducting a low supply voltage, an electrostatic discharge (ESD) protection configuration for signal inputs and outputs with an overvoltage tolerance for the CMOS circuit, the ESD protection configuration comprising:
- a NMOS transistor having a gate and functioning as an ESD protection element connected between the input/output pad and the low supply voltage terminal, said NMOS transistor having a channel with one of a corresponding doping and lightly doped regions formed in said channel resulting in a high threshold voltage of about 2 V being obtained; and
- a voltage divider connected to the input/output pad and applying an increased voltage of about 1 V to said gate, said voltage divider containing a capacitor and a resistor and a parallel circuit formed by said capacitor connected in parallel with said resistor.

2. A CMOS circuit, comprising:

a terminal functioning as an input/output pad;

a low supply voltage terminal for conducting a low supply voltage;

an electrostatic discharge (ESD) protection configuration for signal inputs and outputs with an overvoltage tolerance, said ESD protection configuration including an NMOS transistor having a gate and functioning as an ESD protection element connected between said input/output pad and said low supply voltage terminal, said NMOS transistor having a channel with one of a channel doping and lightly doped regions formed in said channel resulting in a high threshold voltage of about 2 V being obtained, and
- a voltage divider connected to said input/output pad and applying an increased voltage of about 1 V to said gate, said voltage divider including a capacitor and a resistor and a parallel circuit formed of said capacitor connected in parallel with said resistor.

3. The combination of claim 1, wherein said voltage divider is connected between said input/output pad and said gate.

4. The CMOS circuit of claim 2, wherein said voltage divider is connected between said input/output pad and said gate.

* * * * *